United States Patent
Hsieh et al.

(10) Patent No.: US 7,484,138 B2
(45) Date of Patent: Jan. 27, 2009

(54) METHOD AND SYSTEM FOR IMPROVING RELIABILITY OF MEMORY DEVICE

(75) Inventors: Chen-Hui Hsieh, Chu-Pei (TW); Kun Lung Chen, Taipei (TW); Shine Chien Chung, Taipei Hsien (TW); Grigori Grigoriev, Nepean (CA)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 412 days.

(21) Appl. No.: 11/450,535

(22) Filed: Jun. 9, 2006

(65) Prior Publication Data
US 2007/0291560 A1   Dec. 20, 2007

(51) Int. Cl.
*G11C 29/00* (2006.01)
*G01R 31/28* (2006.01)

(52) U.S. Cl. .................................. 714/710; 714/733
(58) Field of Classification Search .............. 714/710, 714/733
See application file for complete search history.

(56) References Cited

U.S. PATENT DOCUMENTS

| | | | | |
|---|---|---|---|---|
| 5,392,292 A | * | 2/1995 | Davis et al. | 714/7 |
| 5,835,504 A | | 11/1998 | Balkin et al. | 371/21.6 |
| 6,505,313 B1 | | 1/2003 | Phan et al. | 714/718 |
| 6,640,321 B1 | * | 10/2003 | Huang et al. | 714/720 |
| 6,691,264 B2 | * | 2/2004 | Huang | 714/723 |
| 6,871,297 B2 | * | 3/2005 | Puri et al. | 714/30 |
| 6,965,534 B2 | * | 11/2005 | Kim | 365/203 |
| 7,174,486 B2 | * | 2/2007 | Adams et al. | 714/710 |
| 2002/0194558 A1 | * | 12/2002 | Wang et al. | 714/718 |
| 2005/0066226 A1 | * | 3/2005 | Adams et al. | 714/7 |

* cited by examiner

*Primary Examiner*—James C Kerveros
(74) *Attorney, Agent, or Firm*—K & L Gates LLP

(57) ABSTRACT

A system for improving reliability of a memory device includes one or more memory banks, each of which has one or more regular memory cell rows and one or more redundant memory cell rows. At least one built-in-self-test (BIST) unit is coupled to the memory banks for testing the redundant memory cell rows to determine their respective quality standards, and testing the regular memory cell rows to identify the regular memory cell row that fails to pass a predetermined quality standard. At least one built-in-self-repair (BISR) unit is coupled to the BIST unit for replacing the failed regular memory cell row with the redundant memory cell row having a quality standard equal to or higher than the predetermined quality standard. The BIST unit repeatedly tests the regular memory cell rows a number of times, with each time applying a different quality standard.

20 Claims, 5 Drawing Sheets

METHOD AND SYSTEM FOR IMPROVING RELIABILITY OF MEMORY DEVICE

BACKGROUND

The present invention relates to integrated circuit (IC) designs, and more particularly to a method and a system for improving the reliability of memory device.

A memory device typically includes a number of memory banks coupled with a number of circuit modules that control the operation of those memory banks. The memory bank usually includes a number of memory cells arranged in rows and columns for data storage. Besides the regular memory cell rows, the memory bank would also include one redundant memory cell row that has the same number of memory cells as the regular memory cell row. The redundant memory cell row is conventionally reserved for replacing the regular memory cell row that is defective. The replacement can be done by readdressing the defective regular memory cell row to the redundant memory cell row without physically rerouting the wiring of the memory device.

Conventionally, the redundant memory cell row is used only when the regular memory cell row is defective. While a regular memory cell row passing the minimal functionality test is not defective, it may be unreliable. The unreliable regular memory cell row may fail after a few hundred operation cycles and cause problems to the memory device. Thus, the conventional scheme, which cannot utilize the redundant memory cell rows to replace the unreliable but non-defective regular memory cell rows, has no effect on the reliability of the memory device.

Moreover, the conventional scheme is typically carried out using an external testing apparatus, instead of a circuit module embedded on the memory device. This is very time-consuming and cost inefficient.

It is therefore desirable to have a method and system for more efficiently utilizing the redundant memory cell rows to improve the reliability of the memory device.

SUMMARY

The present invention discloses a system for improving reliability of a memory device. In one embodiment of the invention, the system includes one or more memory banks, each of which has one or more regular memory cell rows and one or more redundant memory cell rows. At least one built-in-self-test (BIST) unit is coupled to the memory banks for testing the redundant memory cell rows to determine their respective quality standards, and testing the regular memory cell rows to identify the regular memory cell row that fails to pass a predetermined quality standard. At least one built-in-self-repair (BISR) unit is coupled to the BIST unit for replacing the failed regular memory cell row with the redundant memory cell row having a quality standard equal to or higher than the predetermined quality standard. The BIST unit repeatedly tests the regular memory cell rows a number of times, with each time applying a different quality standard.

The construction and method of operation of the invention, however, together with additional objectives and advantages thereof will be best understood from the following description of specific embodiments when read in connection with the accompanying drawings.

DESCRIPTION

Figure 1:
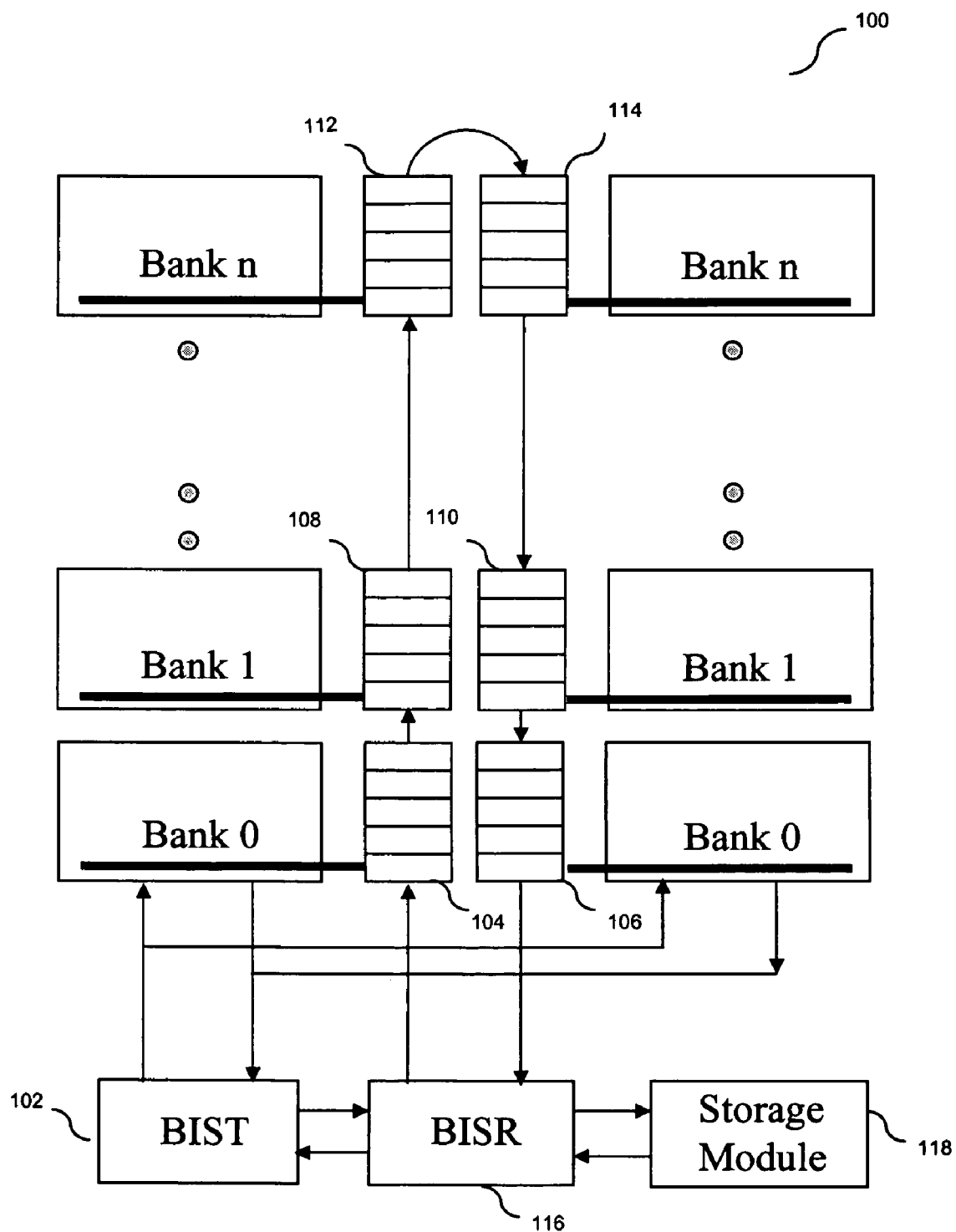
FIG. 1 illustrates a block diagram of a system for improving the reliability of memory device in accordance with one embodiment of the present invention.

FIG. 1 illustrates a block diagram of a system 100 for improving the reliability of memory device in accordance with one embodiment of the present invention. The system 100 includes at least one built-in-self-test (BIST) unit 102 coupled to a number of memory banks Bank 0, Bank 1 . . . , Bank n, each of which further includes a number of regular memory cell rows and at least one redundant memory cell row (not specifically shown in this figure). A number of shift registers 104, 108 and 112 are coupled to the left portions of memory banks Bank 0, Bank 1, and Bank n, respectively, while a number of shift registers 106, 110 and 114 are coupled to the right portions of the memory banks Bank 0, Bank 1, and Bank n, respectively. A built-in-self-repair (BISR) unit 116 is coupled to the BIST unit 102, the shift registers 104, 106, 108, 110, 112 and 114, and a storage module 118 that is used to permanently store the values of the shift registers as the memory banks are decoupled from a power supply. While only six shift registers 104, 106, 108, 110, 112, and 114 are shown in the figure, it is understood by those skilled in the art that the system 100 can include more than six shift registers if the number of the memory banks exceeds three.

As the system 100 operates, the BIST unit 102 tests the redundant memory cell rows to determine their respective quality indexes indicating their corresponding quality standards, which can be various levels of electrical characteristics. For example, supposing the memory device is a dynamic random access memory (DRAM) device, the quality standards can be various levels of the charge/discharge time of the memory capacitor. A DRAM cell row can be categorized as having a 4 ms quality standard, if it passes the test for 4 ms charge and discharge time, but fails other more stringent tests. Similarly, a DRAM cell row can be categorized as having a 5 ms quality standard, if it passes the test for 5 ms charge/discharge time, but fails other more stringent tests. In this embodiment, the memory cell rows can be categorized into the 4 ms, 5 ms and 6 ms groups, in which 6 ms is a higher standard than 5 ms, and 5 ms is a higher standard than 4 ms. A memory cell row that cannot function at all is called a defective memory cell row.

The quality indexes of the tested redundant memory cell rows are temporarily stored in their corresponding shift registers. Such quality index can be a sequence of bits. For example, the quality indexes of the redundant memory cell rows for the memory banks Bank 0, Bank 1 and Bank n are stored in the shift registers 104, 108 and 112, respectively. The following table I shows an example of the quality indexes and their respective quality standards:

TABLE I

| Quality Index | Quality Standard |
|---|---|
| 00011 | Defective |
| 00000 | 4 ms level |
| 00001 | 5 ms level |
| 00010 | 6 ms level |

Figure 2:
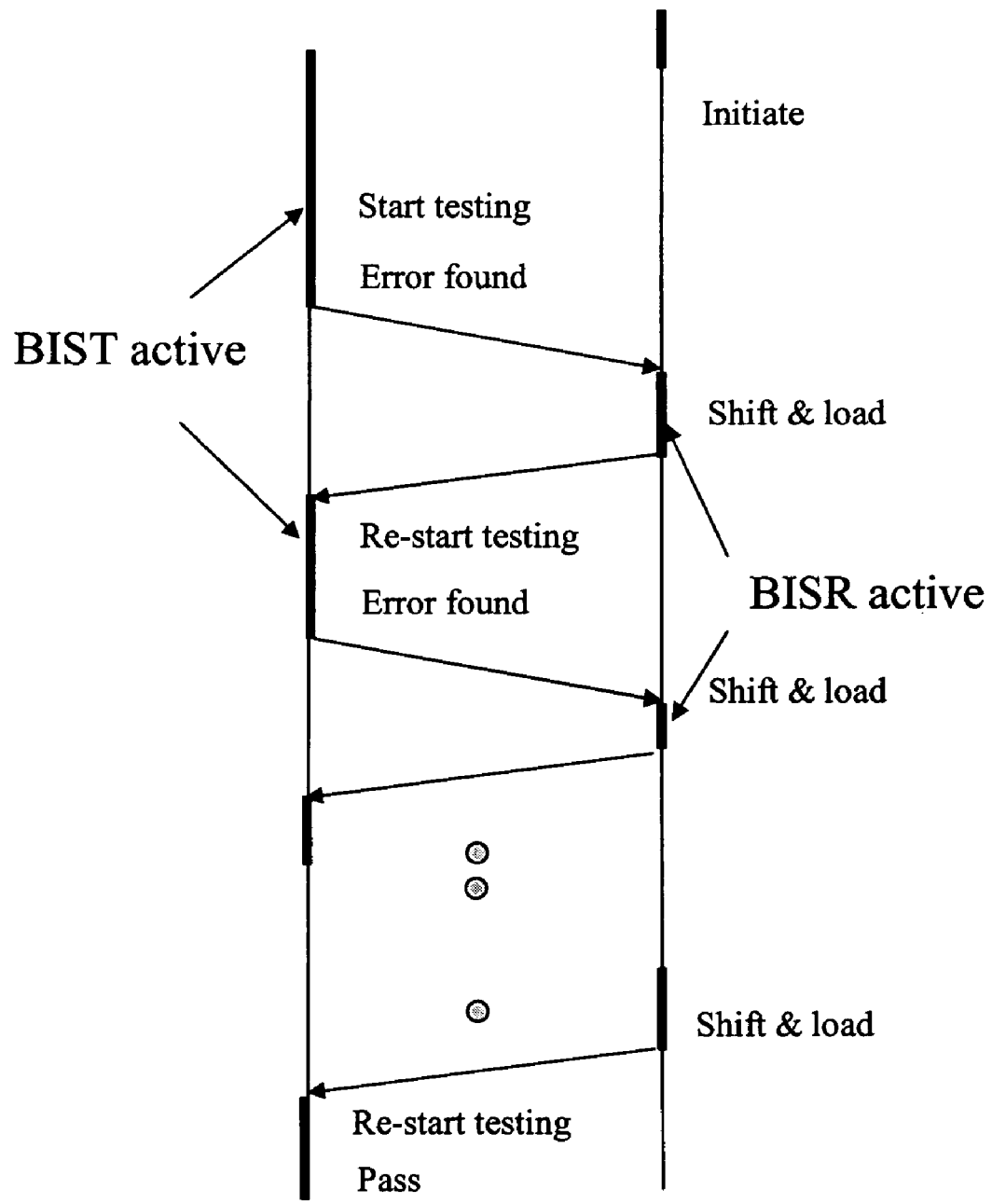
FIG. 2 illustrates a diagram showing how the system operates in accordance with the embodiment of the present invention.

FIG. 2 illustrates a diagram 200 showing how the system 100 in FIG. 1 operates in accordance with the embodiment of the present invention. Referring to FIGS. 1 and 2 simultaneously, after the quality indexes of the redundant memory cell rows are stored in the shift registers, the BIST unit 102 tests the regular memory cell rows of the memory banks to determine if the row passes a predetermined quality standard. If the regular memory cell row fails to pass the predetermined quality standard, BIST unit 102 will stop the testing and activates the BISR unit to replace the failed regular memory cell row with a redundant memory cell row having a quality standard equal to or higher than the predetermined quality standard. For example, if the regular memory cell row fails the 4 ms test, it can be replaced by the redundant memory cell having a quality standard equal to or higher than the 4 ms level. If the regular memory cell row fails the 5 ms test, it can be replaced by the redundant memory cell row having a quality standard equal to or higher than the 5 ms level, but it cannot be replaced by the redundant memory cell row having a quality standard of 4 ms. After the replacement is done, the BIST unit 102 will restart the test for the remaining regular memory cell rows. Once the test completes, the BIST unit 102 will test the regular memory cell rows all over again with a higher quality standard. For example, after the BIST unit 102 has tested all of the regular memory cell rows using the 4 ms standard, it will test the memory rows all over again with a higher standard, such as the 5 ms level.

Figure 3:
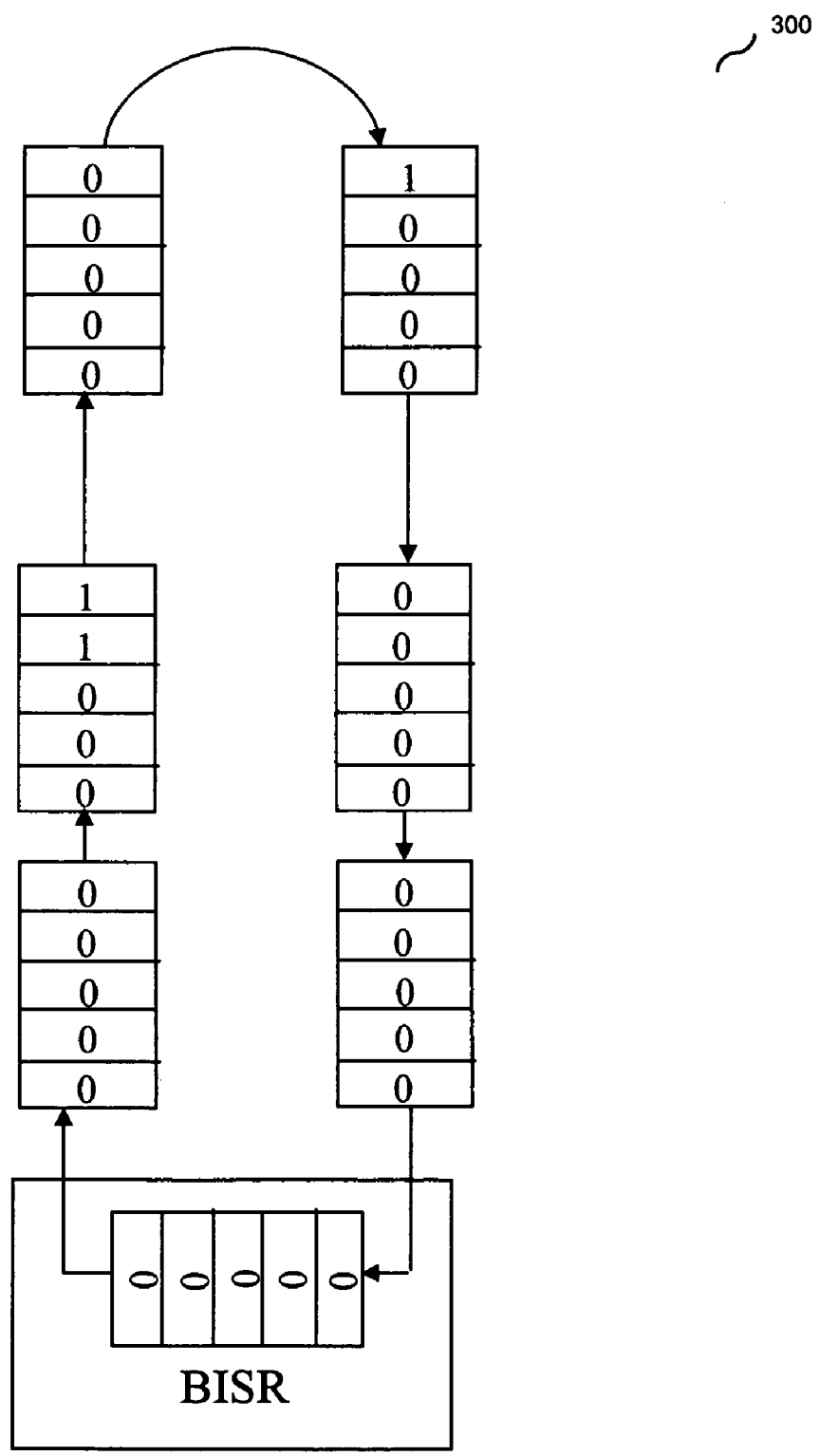
FIG. 3 illustrates a diagram showing how a regular memory cell row is replaced by a redundant memory cell row in accordance with the embodiment of the present invention.

FIG. 3 illustrates a diagram 300 showing how a regular memory cell row is replaced by a redundant memory cell row in accordance with the embodiment of the present invention. Referring to FIGS. 1 and 3 simultaneously, BIST units 102 activates BISR unit 116 when it identifies a failed regular memory cell row and stops testing process. The BISR unit 116 replaces the failed regular memory cell row with its corresponding redundant memory cell row by storing an address of the failed regular memory cell row in the shift register related to the corresponding redundant memory cell row. For example, when the BIST unit 102 detects a failed regular memory cell row in the memory bank Bank 0 and the shift register 104 indicates that its corresponding redundant memory cell row has a quality standard higher than that of the failed row, the address of the failed row will be stored in the shift register 104 in replacement of the originally stored quality index. The BISR unit 116 stores the address of the failed regular memory cell row by shifting logic positions of the shift registers for allowing the unit to load the address onto the shift register related to the failed row.

After the BIST unit 102 completes the tests, the shift registers 104, 106, 108, 110, 112, and 114, will contain addresses of the failed regular memory cell rows and may be some quality indexes of some unused redundant memory cell rows. Since the shift registers can only store values temporarily, the values of the shift registers would be permanently stored in the storage module 118 in order to avoid losing them as the shift registers are decoupled from a power supply. The storage module 118 can be an electrical fuse array or any no-volatile memory devices, such as read only memories (ROM), electrical erasable programmable read only memories (EEPROM), and flash memories.

Figure 4:
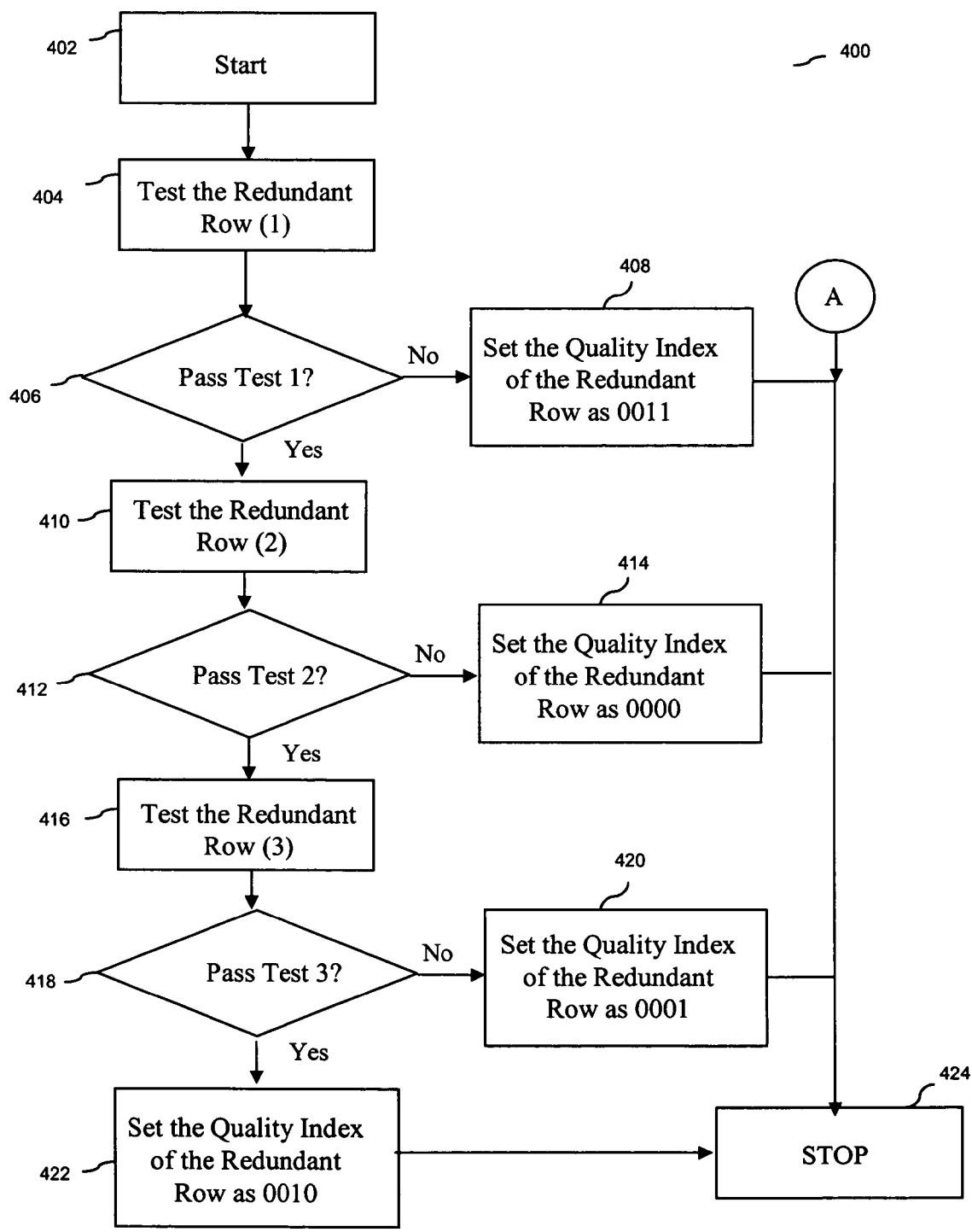
FIG. 4 illustrates a flowchart showing a process for determining the quality standards of the redundant memory cell rows in accordance with the embodiment of the present invention.

FIG. 4 illustrates a flowchart 400 showing a process for determining the quality standards of the redundant memory cell rows in accordance with the embodiment of the present invention. The process starts at step 402. The redundant memory cell row is tested based on the first quality standard at step 404. Whether the redundant memory cell row passes the first test is determined at step 406. If redundant memory cell row does not pass the first test, the quality index of the redundant memory cell row will be set as "0011," which indicates that the redundant row is defective, at step 408. If the redundant memory cell row passes the first test, it will be tested based on the second quality standard at step 410. Whether the redundant memory cell row passes the second test is determined at step 412. If redundant memory cell row does not pass the second test, the quality index of the redundant row will be set as "0000," which indicates that it has a 4 ms quality standard, at step 414. If the redundant memory cell row passes the second test, it will be tested based on the third quality standard at step 416. Whether the redundant memory cell row passes the third test is determined at step 418. If redundant memory cell row does not pass the third test, the quality index of the redundant row will be set as "0001," which indicates that it has a 5 ms quality standard, at step 420. If the redundant memory cell row passes the third test, the quality index of the redundant row will be set as "0010," which indicates that it has a 6 ms quality standard, at step 422. Thereafter, the process will stop at step 424.

It is noted that while the process 400 includes three tests of various quality standards, it can be modified to include two or more than three tests without departing the principles of the invention. Furthermore, the quality indexes shown in this figure are mere examples, and can be changed depending on the needs of design.

Figure 5:
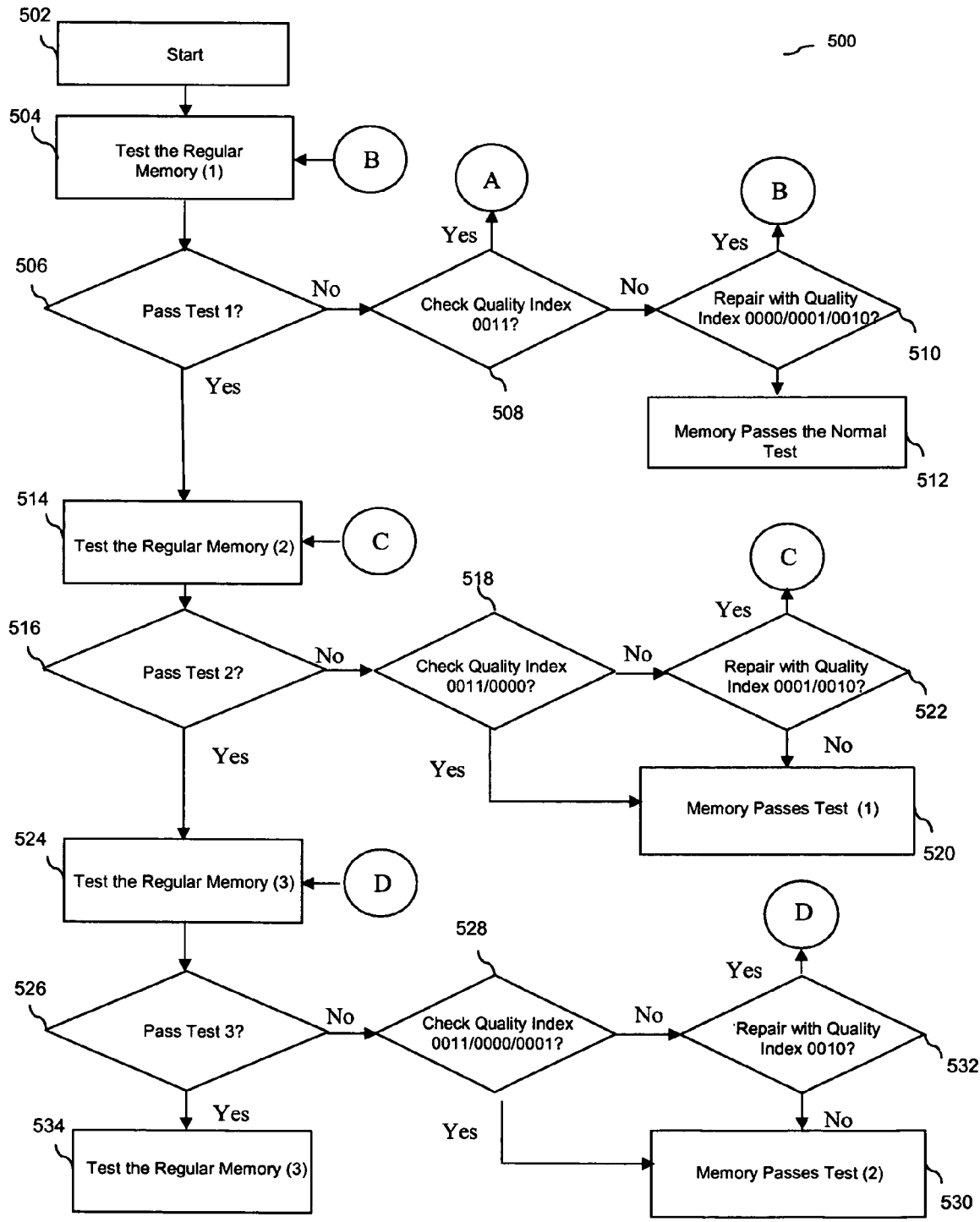
FIG. 5 illustrates a flowchart showing a process for selectively replacing the regular memory cell rows with the redundant memory cell rows in accordance with the embodiment of the present invention.

FIG. 5 illustrates a flowchart showing a process 500 for selectively replacing the regular memory cell rows with the redundant memory cell rows in accordance with the embodiment of the present invention. The process starts at step 502. The regular memory cell row is tested based on the first quality standard at step 504. Whether the regular memory cell row passes the first test is determined at step 506. If it fails to pass the first test, the process will determine if the quality index of its corresponding redundant memory cell row is "0011" at step 508. If the quality index is "0011," which means the redundant memory cell row is defective, the process will proceed to node A. If the quality index is not "0011," the process will determine if the corresponding redundant memory cell has a quality standard, such as "0000," "0001," and "0010," higher than "0011" so that it can replace the failed regular memory cell row at step 510. If the redundant memory cell row does have a higher quality standard, the failed regular memory cell row will be replaced and the process will proceed to node B. Otherwise, the regular memory cell row will be categorized as having a normal quality standard, which means the memory row is merely operable, but does not pass any higher quality tests, at step 512.

If the regular memory cell row passes the first test, it will be tested based on the second quality standard at step 514. The second quality standard is a higher standard than the first quality standard. For example, the second quality standard is at the 5 ms level, while the first quality standard is at the 4 ms level. Whether the regular memory cell row passes the second test is determined at step 516. If it fails to pass the second test, the process will determined if the quality index of its corresponding redundant memory cell row is "0011" or "0000" at step 518. If the quality index is "0011" or "0000," the regular memory cell row will be categorized as passing the first quality standard at step 520. If the quality index is neither "0011" nor "0000," the process will determine if the corresponding redundant memory cell has a higher quality standard, such as "0001" and "0010," so that it can replace the failed regular memory cell row at step 522. If the redundant memory cell row does have a higher quality standard, the failed regular memory cell row will be replaced and the process will proceed to node C.

If the regular memory cell row passes the second test, it will be tested based on the third quality standard at step 524. The third quality standard is a higher standard than the second quality standard. For example, the third quality standard is at the 6 ms level, while the second quality standard is at the 5 ms level. Whether the regular memory cell row passes the third test is determined at step 526. If it fails to pass the third test, the process will determine if the quality index of its corresponding redundant memory cell row is "0011," "0000," or "0001" at step 528. If the quality index is "0011," "0000," or "0001," the regular memory cell row will be categorized as passing the second quality standard at step 530. If the quality index is not "0011," "0000," or "0001," the process will determine if the corresponding redundant memory cell has a higher quality standard, such as "0010," so that it can replace the failed regular memory cell row at step 532. If the redundant memory cell row does have a higher quality standard, the failed regular memory cell row will be replaced and the process will proceed to node D. If the regular memory cell row passes the third test, it will be categorized as passing the third quality standard at step 534.

The present invention provides a system and a method to replace not only defective, but also unreliable regular memory cell rows with stronger and more reliable redundant memory cell rows. Thus, the reliability of memory device can be improved. Moreover, since the proposed system is built on the memory device, it can reduce the costs and time in the process of replacing the memory cell rows.

The above illustration provides many different embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A system for improving reliability of a memory device, comprising:
    one or more memory banks, each of which has one or more regular memory cell rows and one or more redundant memory cell rows;
    at least one built-in-self-test (BIST) unit coupled to the memory banks for testing the redundant memory cell rows to determine their respective quality standards, and testing the regular memory cell rows to identify the regular memory cell row that fails to pass a predetermined quality standard; and
    at least one built-in-self-repair (BISR) unit coupled to the BIST unit for replacing the failed regular memory cell row with the redundant memory cell row having a quality standard equal to or higher than the predetermined quality standard,
    wherein the BIST unit repeatedly tests the regular memory cell rows a number of times, with each time applying a different quality standard.

2. The system of claim 1 wherein the BIST unit stops testing the regular memory cell rows when the regular memory cell row that fails to pass the predetermined quality standard is identified.

3. The system of claim 1 further comprising one or more shift registers coupled to the memory banks for storing one or more quality indexes indicating the quality standards of their corresponding redundant memory cell rows.

4. The system of claim 3 wherein each of the quality indexes comprise a sequence of bits.

5. The system of claim 3 wherein the BISR unit replaces the failed regular memory cell row with its corresponding redundant memory cell row by storing an address of the failed regular memory cell row in the shift register related to the corresponding redundant memory cell row.

6. The system of claim 5 wherein the BISR unit stores the address of the failed regular memory cell row by shifting logic positions of the shift registers for allowing the BISR unit to load the address onto the shift register related to the corresponding redundant memory cell row.

7. The system of claim 6 further comprising at least one storage module coupled to the BISR unit for permanently storing values of the shift registers.

8. A method for improving reliability of a memory device having a number of regular memory cell rows and redundant memory cell rows, comprising:
    testing the redundant memory cell rows to determine their respective quality standards;
    first testing the regular memory cell rows to identify the regular memory cell row that fails to pass a first predetermined quality standard;
    first replacing the regular memory cell row that fails to pass the first predetermined quality standard with the redundant memory cell row having a quality standard equal to or higher than the first predetermined quality standard;
    second testing the regular memory cell rows to identify the regular memory cell row that fails to pass a second predetermined quality standard, which is higher than the first predetermined quality standard; and
    second replacing the regular memory cell row that fails to pass the second predetermined quality standard with the redundant memory cell row having a quality standard equal to or higher than the second predetermined quality standard.

9. The method of claim 8 wherein the step of testing the redundant memory cell rows further comprises storing one or more quality indexes indicating the quality standards of their corresponding redundant memory cell rows in a number of shift registers.

10. The method of claim 9 wherein each of the quality indexes comprises a sequence of bits.

11. The method of claim 9 wherein the step of first testing the regular memory cell rows stops when the regular memory cell row that fails to pass the first predetermined quality standard is identified, and the step of second testing the regular memory cell rows stops when the regular memory cell row that fails to pass the second predetermined quality standard is identified.

12. The method of claim 11 wherein the step of first replacing the regular memory cell row further comprises storing an address of the regular memory cell row that fails to pass the first predetermined quality standard in the shift register related to its corresponding redundant memory cell row.

13. The method of claim 12 wherein the step of second replacing the regular memory cell row further comprises storing an address of the regular memory cell row that fails to pass the second predetermined quality standard in the shift register related to its corresponding redundant memory cell row.

14. The method of claim 13 wherein the address of the failed regular memory cell row is stored by shifting logic positions of the shift registers for allowing the shift register related to the corresponding redundant memory cell row to be loaded with the address.

15. The method of claim 14 further comprising a step of permanently storing values of the shift registers in a storage module.

16. A system for improving reliability of a memory device, comprising:
one or more memory banks, each of which has one or more regular memory cell rows and one or more redundant memory cell rows;
one or more shift registers coupled to the memory banks for storing one or more quality indexes indicating quality standards of their corresponding redundant memory cell rows
at least one built-in-self-test (BIST) unit coupled to the memory banks for testing the regular memory cell rows to identify the regular memory cell row that fails to pass a predetermined quality standard; and
at least one built-in-self-repair (BISR) unit coupled to the BIST unit for replacing the regular memory cell row that fails to pass the predetermined quality standard with the redundant memory cell row having a quality standard equal to or higher than the predetermined quality standard,
wherein the BIST unit repeatedly tests the regular memory cell rows a number of times, with each time applying a different quality standard.

17. The system of claim 16 wherein the BIST unit stops testing the regular memory cell rows when the regular memory cell row that fails to pass the predetermined quality standard is identified.

18. The system of claim 17 wherein the BISR unit replaces the failed regular memory cell row with its corresponding redundant memory cell row by storing an address of the failed regular memory cell row in the shift register related to the corresponding redundant memory cell row.

19. The system of claim 18 wherein the BISR unit stores the address of the failed regular memory cell row by shifting logic positions of the shift registers for allowing the BISR unit to load the address onto the shift register related to the corresponding redundant memory cell row.

20. The system of claim 19 further comprising at least one storage module coupled to the BISR unit for permanently storing values of the shift registers.

* * * * *